United States Patent
Banach et al.

(10) Patent No.: US 7,867,686 B2
(45) Date of Patent: Jan. 11, 2011

(54) METAL DEPOSITION

(75) Inventors: Michael J. Banach, Cambridge (GB); John Mills, Cambridge (GB); James Watts, Cambs (GB); Alan Lionel Hudd, Herts (GB); James Edward Fox, Cambridge (GB); Philip Gareth Bentley, Cambridge (GB)

(73) Assignees: Plastic Logic Limited, Cambridge (GB); Conductive Inkjet Technology Limited, West Yorkshire (GB)

( * ) Notice: Subject to any disclaimer, the term of this patent is extended or adjusted under 35 U.S.C. 154(b) by 661 days.

(21) Appl. No.: 10/588,945

(22) PCT Filed: Feb. 10, 2005

(86) PCT No.: PCT/GB2005/000458

§ 371 (c)(1),
(2), (4) Date: Dec. 19, 2007

(87) PCT Pub. No.: WO2005/079126

PCT Pub. Date: Aug. 25, 2005

(65) Prior Publication Data

US 2008/0283275 A1  Nov. 20, 2008

(30) Foreign Application Priority Data

Feb. 10, 2004  (GB) .................. 0402960.9

(51) Int. Cl.
*G03F 7/00* (2006.01)
*G03F 7/20* (2006.01)
*B05D 3/00* (2006.01)
*G21H 5/00* (2006.01)

(52) U.S. Cl. .............. 430/270.1; 430/311; 430/330; 430/331; 430/322; 427/555

(58) Field of Classification Search .............. 430/270.1, 430/311, 330, 331, 322; 427/555
See application file for complete search history.

(56) References Cited

U.S. PATENT DOCUMENTS

| | | | |
|---|---|---|---|
| 4,486,463 A | | 12/1984 | Rubner et al. |
| 4,830,880 A | * | 5/1989 | Okubi et al. ............... 427/98.1 |
| 5,084,299 A | | 1/1992 | Hirsch et al. |
| 5,192,581 A | * | 3/1993 | Hirsch et al. ................ 427/556 |
| 6,461,678 B1 | * | 10/2002 | Chen et al. .................. 427/304 |

(Continued)

FOREIGN PATENT DOCUMENTS

EP  0 484 808 A  5/1992

(Continued)

OTHER PUBLICATIONS

Japanese Office Action dated Jun. 16, 2009.

*Primary Examiner*—Amanda C. Walke
(74) *Attorney, Agent, or Firm*—Sughrue Mion, PLLC

(57) ABSTRACT

A method for electroless plating of metal on a laser-patterned substrate. A substrate is provided on which both a thermal imaging layer and catalytic layer are deposited. On exposure to a laser beam, sufficient levels of radiation are converted to heat in the thermal imaging layer to render the exposed regions of the adjacent catalytic layer inactive. The laser-patterned substrate is then exposed to a reaction solution which initiates the growth of a metal film on the unexposed regions of the catalytic layer.

19 Claims, 10 Drawing Sheets

U.S. PATENT DOCUMENTS

| | | | |
|---|---|---|---|
| 6,605,534 B1 * | 8/2003 | Chung et al. | 438/674 |
| 6,686,256 B2 | 2/2004 | Kanoh et al. | |
| 6,847,107 B2 * | 1/2005 | Fjelstad et al. | 257/690 |
| 6,900,126 B2 * | 5/2005 | Carter et al. | 438/678 |
| 7,060,617 B2 * | 6/2006 | Dubin et al. | 438/687 |

FOREIGN PATENT DOCUMENTS

| | | |
|---|---|---|
| JP | 61-61489 A | 3/1986 |
| JP | 4-272182 A | 9/1992 |
| JP | 6-77626 A | 3/1994 |

* cited by examiner

METAL DEPOSITION

The present invention relates to the deposition of metal on substrates, particularly the catalytic deposition of metal on a substrate from a solution of metal ions.

Electroless metal plating is a popular method of depositing metal films in many industries, especially in the production of printed circuit boards. A generic electroless plating process requires several steps. The first step is to prepare the surface of the substrate to ensure good adhesion for the subsequently plated metal. This would be followed by a series of baths which results in the surface being saturated with a catalyst, normally palladium colloids. Finally the substrate is dipped into a bath including metal ions and a reducing agent which react to form a metal in the presence of the catalyst on the substrate surface. This method produces a uniform film on the substrate surface that can be subsequently patterned with standard photolithographic and etching technologies to form the features of the circuit board. The resolution of these features is determined by the photolithographic technique used, but feature sizes below 5 µm may be patterned.

In WO04/068389, a method for electroless plating of metals using direct-write technologies is described. A substrate is selectively coated with a metallic material by depositing a reaction solution of metal ions and a reducing agent on the surface preferably by ink-jet printing. The reaction is aided by the presence of an activator where, for example fine metallic particles or an organic salt of a transition metal like palladium acetate, are deposited, which catalyses the reaction. The activator material, when mixed within a polymer binder, may be deposited by a solution deposition technique, such as ink-jet printing. Thus the activator material may be deposited only where metallic material is required to be and subsequently the metal region may be grown by exposure to the reaction solution.

In U.S. Pat. Nos. 5,084,299 and 4,981,715, selective deposition of a conductor material on a substrate surface is described. A polymer layer is initially deposited on the surface of a substrate. The polymer is complexed with a palladium-containing compound, which acts as a catalyst for electroless plating of a metallic layer. An upper photoimagible polymer layer is irradiated and a subsequent developing step removes the non-irradiated regions through a process of chemical wet etching. The irradiated substrate is then exposed to an electroless plating bath to form a metal layer.

In U.S. Pat. No. 5,192,581, a catalyst layer is patterned using a laser on a layered substrate that includes a protective layer. The process used is similar to that used in the patent above but with the addition of a protective layer that is used to solve the sheeting problem which is common in electroless plating processes. The patterning occurs either by a subtractive process, such as a wet chemical etch or a laser-assisted wet chemical deposition of the catalyst particles. In the laser-irradiated regions of the substrate the catalyst becomes insoluble in the wet chemical etching bath, such that the catalyst layer is removed from the substrate only in the non-irradiated regions of the substrate. Electroless deposition may then occur on the predetermined pattern on the layered substrate. This method allows for the process to occur without the need for photolithography while preventing unwanted electroless sheeting on the dielectric substrate which has inadvertently become catalytic in certain regions.

It is an aim of the present invention to provide an improved method of depositing metal on a substrate from a solution of metal ions.

According to a first aspect of the present invention provides a method of forming a metal deposit on a substrate, the method including the steps of: providing a substrate with a first layer of a material whose activity as a catalyst for the deposition of metal from a solution of metal ions is adjustable by an irradiative technique; using said irradiative technique to pattern the first layer into active and non-active regions; and exposing the resulting pattern of active and non-active regions to a solution of metal ions whereby metal is selectively deposited therefrom onto the active regions of the first layer.

According to another aspect of the present invention, there is provided a composition including a catalyst for the reduction of metal ions, and a chromophore.

A first embodiment of the method of the present invention uses a substrate on which a thermal imaging layer is deposited followed by the deposition of a catalytic layer. On exposure of the layered substrate to a laser beam the underlying thermal imaging layer converts radiation from the laser beam to heat, rendering the exposed regions of the catalyst inactive. In a subsequent plating step, the substrate is exposed to a reaction solution of metal ions and a reducing agent, which initiates the growth of a metal film on the unexposed regions of the catalyst, thereby allowing electroless deposition of a metal layer to occur.

Another embodiment of the method of the present invention uses a substrate on which the catalytic layer is coarsely patterned on top of a thermal imaging layer using a solution-based printing technique like ink-jet printing, and laser radiation is used to trim the coarsely patterned catalyst layer to produce higher resolution features.

Another embodiment of the method of the present invention uses a substrate on which a thermal imaging layer is deposited over a previously deposited catalytic layer. On exposure of the layered substrate to a laser beam the thermal imaging layer generates enough heat to render the exposed areas of the catalytic layer into inactive catalytic states. The exposed regions of the catalyst are therefore ineffective to reaction solutions used during subsequent plating steps, which are deposited after the removal of the thermal imaging layer. The metal layer is only formed on the unexposed regions of the catalytic layer. As with the underlying thermal imaging layer, the catalyst layer may also be coarsely patterned using a solution-based printing technique, such as, but not limited to ink-jet printing prior to the deposition of the overlying thermal imaging layer, and laser radiation used to trim the coarsely patterned catalyst layer to produce higher resolution features.

Another embodiment of the method of the present invention involves the deposition of a direct image catalytic layer on a substrate, thereby excluding the need for the deposition of two separate layers, namely a catalytic material and a thermal imaging layer. Exposure of the direct image catalytic layer to a laser beams renders the exposed regions ineffective to the subsequent developing steps, as described above. The substrate and the selectively laser-patterned direct image catalytic layer is then exposed to the reaction solution, where the metal is grown only on the unexposed areas. The direct image catalyst layer may also be coarsely patterned using a solution-based printing technique, such as, but not limited to ink-jet printing, and laser radiation used to trim the coarsely patterned catalyst layer to produce higher resolution features, as described above.

Embodiments of the present invention will now be described in detail, by way of example only, with reference to the accompanying drawings, in which.

Figure 1:
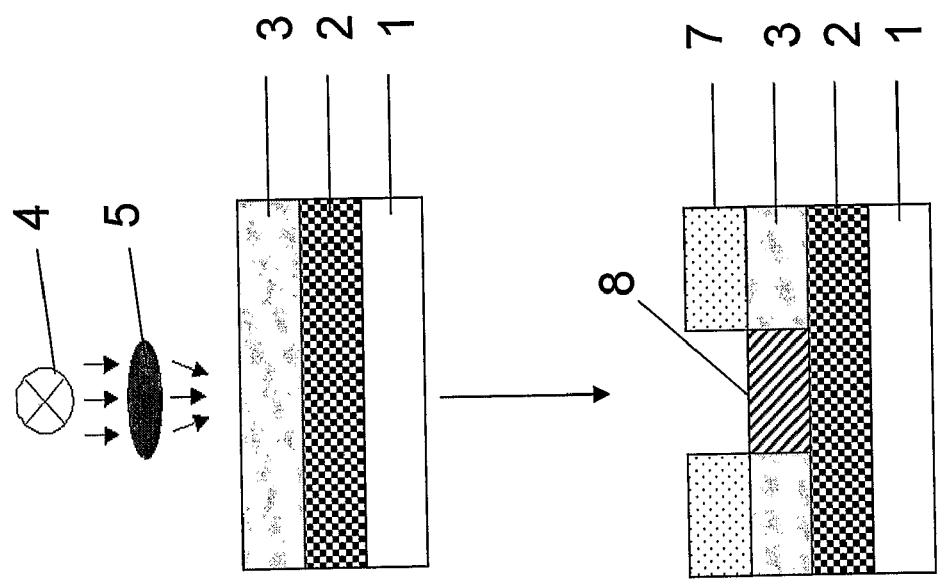
FIG. 1 illustrates processing steps for electroless metal plating on a substrate according to a first embodiment that incorporates a thermal imaging layer positioned below the catalyst layer.

With reference to the drawings, the first embodiment of the present invention is illustrated in FIG. 1. The first embodiment provides a catalytic layer and an underlying thermal imaging layer deposited on a substrate. The absorbed radiation is converted to heat in the thermal imaging layer which renders the exposed regions of the catalyst layer inactive. This results in the patterning of an electroless metal layer on the substrate surface.

A substrate 1 is coated with a thermal imaging material 2. The substrate material is preferably, but not limited to glass or a polymer film. A thermal imaging material is one that is able to convert absorbed radiation to heat. The thermal imaging layer (TIL) is preferably coated from solution by standard thin film coating techniques, including but not limited to spin, dip, blade, bar, slot-die, or spray coating, inkjet, gravure, offset or screen printing. The thermal imaging material generates heat from absorbed radiation, for example in the form of a focused laser beam 4 focused through a lens 5, or alternatively from a pattern of light generated by passing a light beam through a shadow mask. The material of the thermal imaging layer should be chosen such that there are good adhesive properties between the thermal imaging layer and the substrate. It is also important that the thermal imaging layer is not dissolved or in any way compromised by the subsequent deposition step of the catalyst layer. The preferred material for the lower level thermal imaging layer is polystyrene mixed with the infrared dye, which is soluble in apolar solvents like xylene. For laser imaging with an infrared laser operating at 830 nm a suitable dye may be SDA4554. The preferred thickness of the film of polystyrene is 500 nm thick and it has an optical density of 0.15 at 830 nm.

A layer of catalyst 3 which can initiate electroless deposition is preferably deposited from solution on top of the thermal imaging layer and dried in order to produce a catalytic film. The properties of the catalytic layer must be such that it templates the growth of a metal film when exposed to a reaction solution consisting of metal ions and reducing agents. The catalytic layer is preferably coated from solution by standard thin film coating techniques, including but not limited to spin, dip, blade, bar, slot-die, or spray coating, inkjet, gravure, offset or screen printing. The properties of the catalyst include heat-sensitive properties, such that on exposure to elevated temperatures, the catalytic film no longer templates the growth of a metal layer. The preferred catalyst material is supplied by Conductive Inkjet Technologies and is described as an activator layer in Patent Number WO2004068389. The catalytic material consists of a palladium acetate catalyst mixed within a polymer binder so that it can be deposited by solution processible techniques. The preferred catalyst formulation incorporates a polymer binder and palladium acetate dissolved in a 50:50 mixture of propylene glycol methyl ether and diacetone alcohol. Suitable materials for the said catalytic layer may include, but are not limited to, compositions that contain a catalytic species (metal or metal ion) and at least one thermoplastic material, said composition exhibiting a thermal transition within the temperature range of the process.

When the underlying thermal imaging layer is exposed to the appropriate wavelength of radiation, heat is generated which promotes a change in these regions of the catalyst, rendering them inactive. The mechanism by which this reaction occurs is dependant on the catalyst material chosen. The selective exposure of the multi-layered substrate results in the patterning of the upper catalytic layer. The selective laser-patterned upper layer consists of alternating regions of active and inactive catalyst. By choosing light of infrared wavelengths between 830-1064 nm, the laser light is unable to be absorbed by underlying semiconductive layers. This is particularly important if the conductive structure formed by a method according to the present invention is part of an electronic device formed in a multilayer configuration, such as for example, a field-effect transistor device made based on a conjugated polymer. Therefore, degradation of underlying electroactive layers within the multi-layer stack on the substrate may be avoided. Although other wavelengths in the visible and ultraviolet spectral range could also be used, care would need to be taken in such cases to minimize exposure of the multi-layers to light, particularly in the presence of oxygen to avoid degradation by processes such as photooxidation. The preferred laser tool is a 832 nm infrared laser diode which has a 5 micron spot size to allow for high resolution patterning. The fluency used is dependent on the temperature needed to destroy the catalytic properties of the catalyst layer and the amount of radiation the thermal imaging layer absorbs. The preferred fluency is 1000-2000 mJ/cm$^2$.

The choice of reaction bath will be determined by both the materials of the catalytic layer used and the metal that is required to be deposited. Some catalyst layers, especially those consisting of an organic acid salt of a transition metal like palladium acetate, may require that the metal ions may be exposed to a reducing agent prior to the reaction bath in order to increase the plating efficiency. This is preferably done by exposing the multi-layered substrate to dimethylamineborane (DMAB). Exposure to the reducing solution may occur by techniques such as those involving dipping the substrate into the solution or by techniques such as inkjet printing the regenerating solution on top of the substrate surface. By exposing the catalyst layer to a reaction bath consisting of the metal ions of choice and an agent capable of reducing those ions into a metal, the growth of the desired metal film will occur. This again may occur as a result of a number of techniques, including but not limited to methods of dipping the substrate into the solution and inkjet printing the solution on to the substrate. Metals such as but not limited to copper, nickel, platinum, palladium, cobalt, and gold can be deposited using this technique. In the preferred method, a copper film was grown using an aqueous reaction bath consisting of approximately 9% copper (II) sulfate, 9% formaldehyde, 4.5% (2-hydroxypropyl) ethylenediamine, 2% methanol, 4% sodium hydroxide, and 0.05% potassium cyanide. The rate of copper deposition may be tuned by further diluting this solution with water. A gate electrode is therefore formed over the DICL layer.

Figure 2:
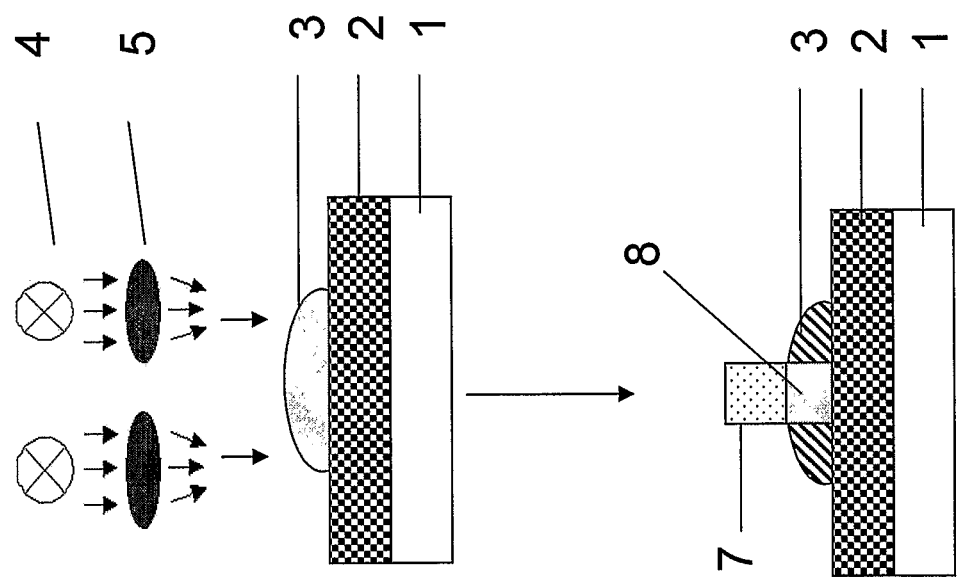
FIG. 2 illustrates processing steps for electroless metal plating on a substrate according to a second embodiment that incorporates a thermal imaging layer positioned below the catalyst layer which is coarsely patterned upon deposition.

With reference to the drawings the second embodiment is illustrated in FIG. 2. In this embodiment, the catalytic layer 3 is deposited using a solution-based patterning technique, such as ink-jet printing, which allows for the patterning of coarse features. The thermal imaging step is then used to trim the coarse patterned features in order to generate a finer pattern.

One advantage of the first embodiment is that the catalytic layer 3 may be deposited using less expensive industrial equipment. The second embodiment is particularly advantageous for high cost materials, as this process leads to a reduction in the amount of catalytic material that is deposited. Also a continuous catalytic film, as used in the first embodiment, can be more prone to buckling due to the stresses in the film that build up during the plating process. A coarsely patterned catalytic layer would be preferable in this situation, as the stress is not as problematic when the plating area is reduced.

Figure 3:
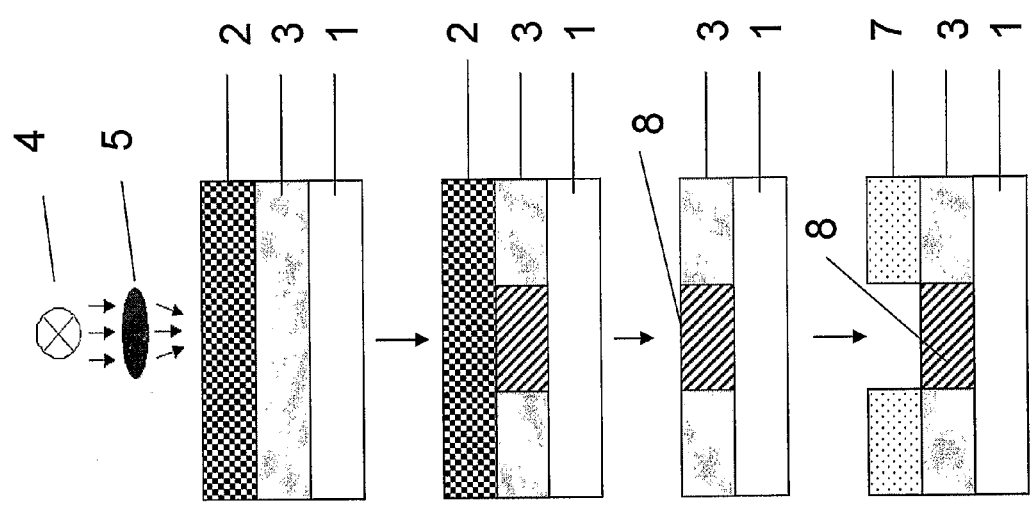
FIG. 3 shows processing steps for electroless metal plating on a substrate according to a third embodiment that incorporates a thermal imaging layer positioned above the catalyst layer.
Figure 4:
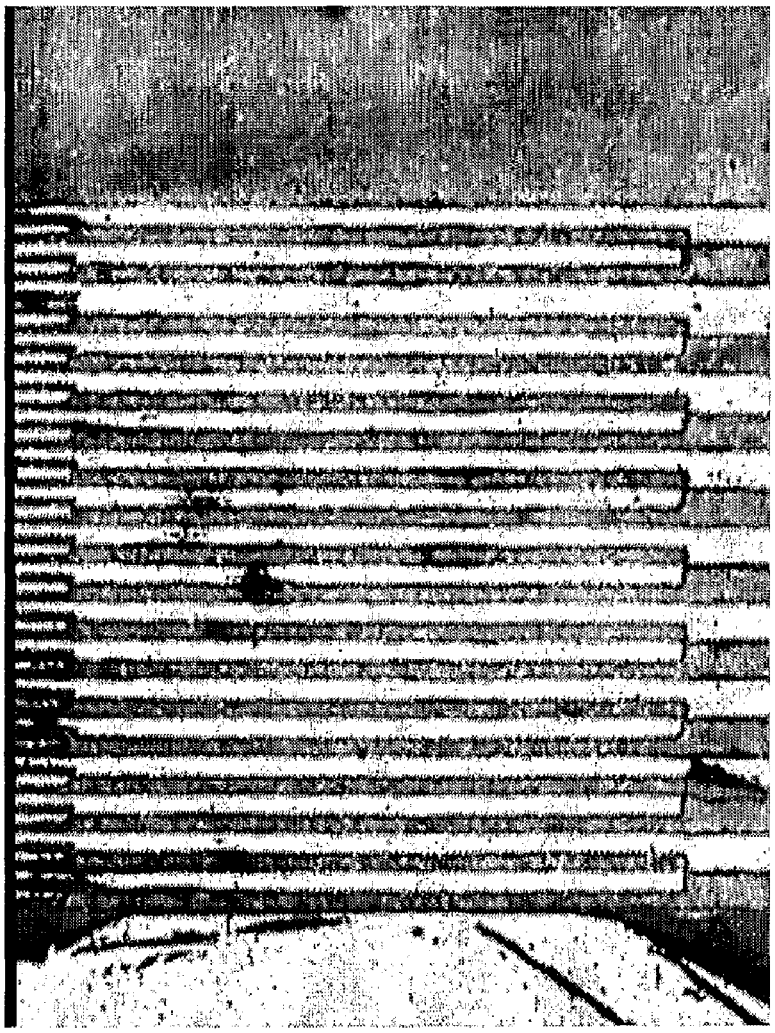
FIG. 4 shows an optical micrograph of copper tracks grown using a thermal imaging layer above the catalyst layer.

A third embodiment is illustrated in FIG. 3. This process provides a catalytic layer 3 that is deposited directly onto the substrate surface. This step is followed by the deposition of a thermal imaging layer 2. The unexposed regions of the catalytic layer are able to initiate electroless deposition.

A substrate 1 is coated with a layer of catalyst 3 which retains the same properties as the catalytic layer described above. However, in addition, the catalytic layer is required to adhere well to the substrate surface. The substrate material is preferably, but is not limited to, glass or a polymer film. The catalytic layer is preferably coated from solution by standard thin film coating techniques, including but not limited to spin, dip, blade, bar, slot-die, or spray coating, inkjet, gravure, offset or screen printing. The properties of the catalytic layer must be such that it will react with a solution of metal ions to initiate the production of a metal film. In addition, the catalyst must have heat-sensitive properties, such that on exposure to elevated temperatures, the catalytic film will no longer be active as a catalytic material. The preferred catalyst material is supplied by Conductive Inkjet Technologies and is described as the activator layer in Patent Number WO2004068389. The activator material consists of a palladium acetate catalyst mixed with a polymer binder so as to possess solution processible properties. The preferred catalyst formulation includes the polymer binder and palladium acetate dissolved in an approximately 50:50 mixture of propylene glycol methyl ether and diacetone alcohol. The preferred film thickness range is from 30 nm-1 micron.

A thermal imaging layer (TIL) 2 is then deposited over the catalytic layer 3. As stated above, a thermal imaging material is one that is able to convert absorbed radiation from the laser beam to heat. The thermal imaging layer is preferably coated from solution by standard thin film coating techniques, including but not limited to spin, dip, blade, bar, slot-die, or spray coating, inkjet, gravure, offset or screen printing. The material and deposition technique must be selected to ensure that the underlying material is not in any way comprised by factors such as dissolution of the underlying layers. Any interaction between the laser dyes that may be used in the TIL and the catalytic material could prevent the catalysis from performing its desired function. A suitable material for the thermal imaging layer must be such that it is capable of dissolving in a solvent that may be cast over a catalytic layer or the catalytic layer may be cast over the thermal imaging layer, without inducing problems, such as the dissolution of the surrounding layers. A preferred thermal imaging layer is polyisobutylene (PIB) mixed with a suitable infrared laser dye, such as SDA4554 for operation at 830 nm. The resultant solution is soluble in very apolar solvents, such as the preferred solvent of dimethylcyclohexane. This solvent was chosen as out preferred solvent, due to the high boiling point of the solvent which facilitates the spinning of the film. The preferred thickness of the film is 100 nm and it has an optical density of at least 0.15 at 835 nm The thermal imaging material generates heat from absorbed IR radiation, for example in the form of a focused laser beam 4 focused through a lens 5, or alternatively from a pattern of light generated by passing a light beam through a shadow mask. A sufficient amount of heat is generated to render the overlying catalyst ineffective to subsequent developing steps. As above this has the result of rendering the exposed regions of the catalytic layer unsusceptible to the formation of a metal film. The selective exposure of the multi-layered substrate results in the patterning of the lower catalytic layer. The selective laser-patterned lower layer consists of alternating regions of active and inactive catalyst. By choosing light of infrared wavelengths between 830-1064 nm, the laser light is unable to be absorbed by most conjugated polymers. Therefore, degradation of underlying electroactive layers within the multi-layer stack on the substrate may be avoided. Although other wavelengths in the visible and ultraviolet spectral range could also be used, care would need to be taken in such cases to minimize exposure of the multi-layers to light, particularly in the presence of oxygen to avoid degradation by processes such as photooxidation. The preferred laser tool is a 832 nm infrared laser diode which has a 5 micron spot size to allow for high resolution patterning. The fluency used is dependent on the temperature needed to destroy the catalytic properties of the catalyst layer and how much radiation the thermal imaging layer absorbs. The preferred fluency is 1000-2000 $mJ/cm^2$.

In this embodiment of the invention the TIL must be stripped after imaging. This is done by exposing the substrate to a bath of an appropriate solvent. For a preferred method, the bath would consist of a solvent used for casting the film, namely dimethylcyclohexane. The subsequent steps in which the catalyst is reduced during a chemical reaction and the metal film is grown are identical to those steps described above.

Figure 5:
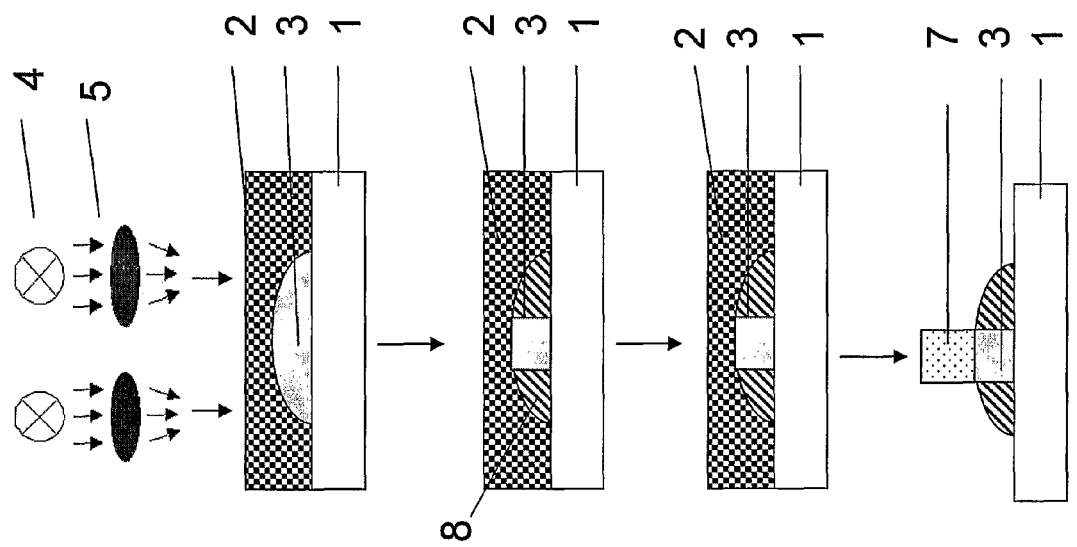
FIG. 5 illustrates processing steps for electroless metal plating on a substrate according to a fourth embodiment that incorporates a thermal imaging layer positioned above the catalyst layer which is coarsely patterned upon deposition.

A fourth embodiment is illustrated in FIG. 5. This embodiment is similar to the third embodiment. However, the catalytic layer 3 is deposited using solution-based patterning techniques which allows for the patterning of coarse features, preferably using techniques such as ink-jet printing. The thermal imaging step is then used to trim the coarse patterned features to generate a finer pattern.

As stated above, an advantage of the third embodiment is that the catalytic layer 3 may be deposited using less expensive industrial equipment. However, the fourth embodiment is advantageous when using costly material as it leads to a reduction in the amount of catalytic material that may be deposited. In addition, a continuous catalytic film, as used in the third embodiment, can be more prone to buckling due to the stresses in the film that build up during the plating process. The coarsely patterned catalytic layer would be preferable if this buckling is a problem as the stress is not as problematic when the plating area is reduced.

Figure 6:
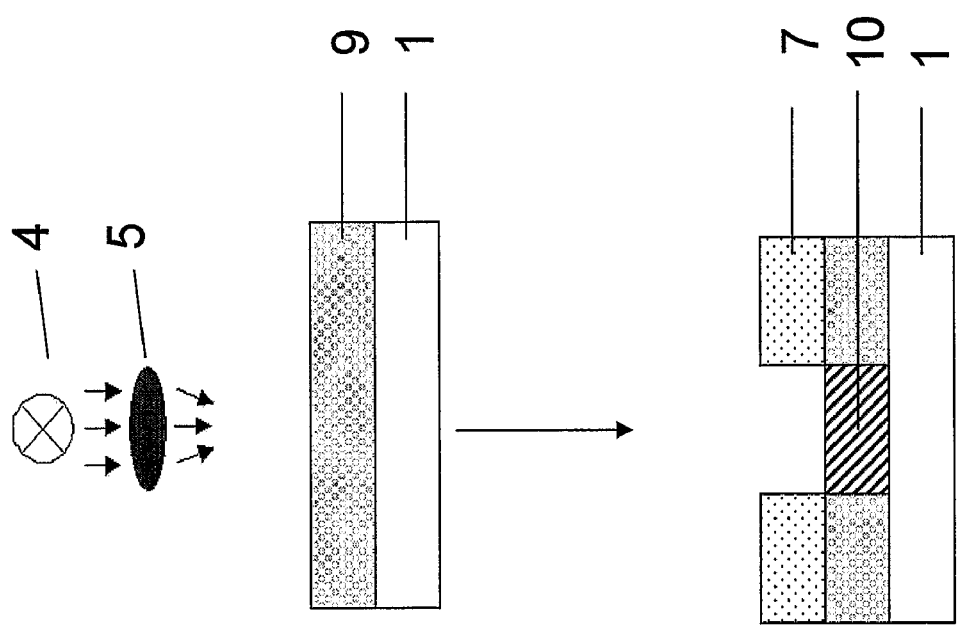
FIG. 6 illustrates processing steps for electroless metal plating on a substrate according to a fifth embodiment that incorporates a catalyst layer that can be directly imaged.

A fifth embodiment of the present invention is illustrated in FIG. 6. The fifth embodiment provides a single direct-image catalytic layer (DICL) on a substrate, thereby excluding the need for the deposition of two separate layers of catalytic material and a thermal imaging layer. The absorbed radiation is converted to heat and thus the DICL can be used as an alternative way of patterning an electroless metal layer.

A substrate 1 is coated with a DICL 9. The substrate is preferably glass or a polymer film but is not limited to either of these materials. The DICL is a layer that is capable of converting absorbed radiation to heat while retaining the ability to catalyse the electroless plating reaction to form a metal layer from a reaction solution. The material for the DICL must be chosen such that there are good adhesive properties between this layer and the substrate and the casting solvent should be chosen to ensure no damage is done to underlying layers upon deposition. The DICL is preferably coated from solution by standard thin film coating techniques, including but not limited to spin, dip, blade, bar, slot-die, or spray coating, inkjet, gravure, offset or screen printing. The preferred DICL is a derivative of the catalyst material supplied by Conductive Inkjet Technologies and is described as the activator layer in Patent Number WO2004068389. The activator layer consists of a palladium acetate catalyst mixed with a polymer binder to enable it to be solution processible. As described above, the preferred catalyst formulation includes the polymer binder and palladium acetate dissolved in a 50:50 mixture of propylene glycol methyl ether and diacetone alcohol. An infrared absorbing material, such as Carbon black is then added to the mixture to absorb the infrared radiation. The preferred film thickness is between 30 nm and 1 micron and should have an optical density of at least 0.15 at 835 nm.

The DICL generates heat from absorbed radiation, for example in the form of a focused laser beam 4 focused through a lens 5, or alternatively from a pattern of light generated by passing a light beam through a shadow mask. The absorption of radiation results in selective regions of the material becoming inactive as a catalyst. By choosing light of infrared wavelengths between 830-1064 nm, the laser light is unable to be absorbed by most conjugated polymers. Therefore, degradation of underlying electroactive layers within the multi-layer stack on the substrate may be avoided. Although other wavelengths in the visible and ultraviolet spectral range could also be used, care would need to be taken in such cases to minimize exposure of the multi-layers to light, particularly in the presence of oxygen to avoid degradation by processes such as photooxidation. The preferred laser tool is a 832 nm infrared laser diode which has a 5 micron spot size to allow for high resolution patterning. The fluency used is dependent on the temperature needed to destroy the catalytic properties of the catalyst layer and how much radiation the thermal imaging layer absorbs. The preferred fluency is 1000-2000 mJ/cm$^2$.

Figure 7:
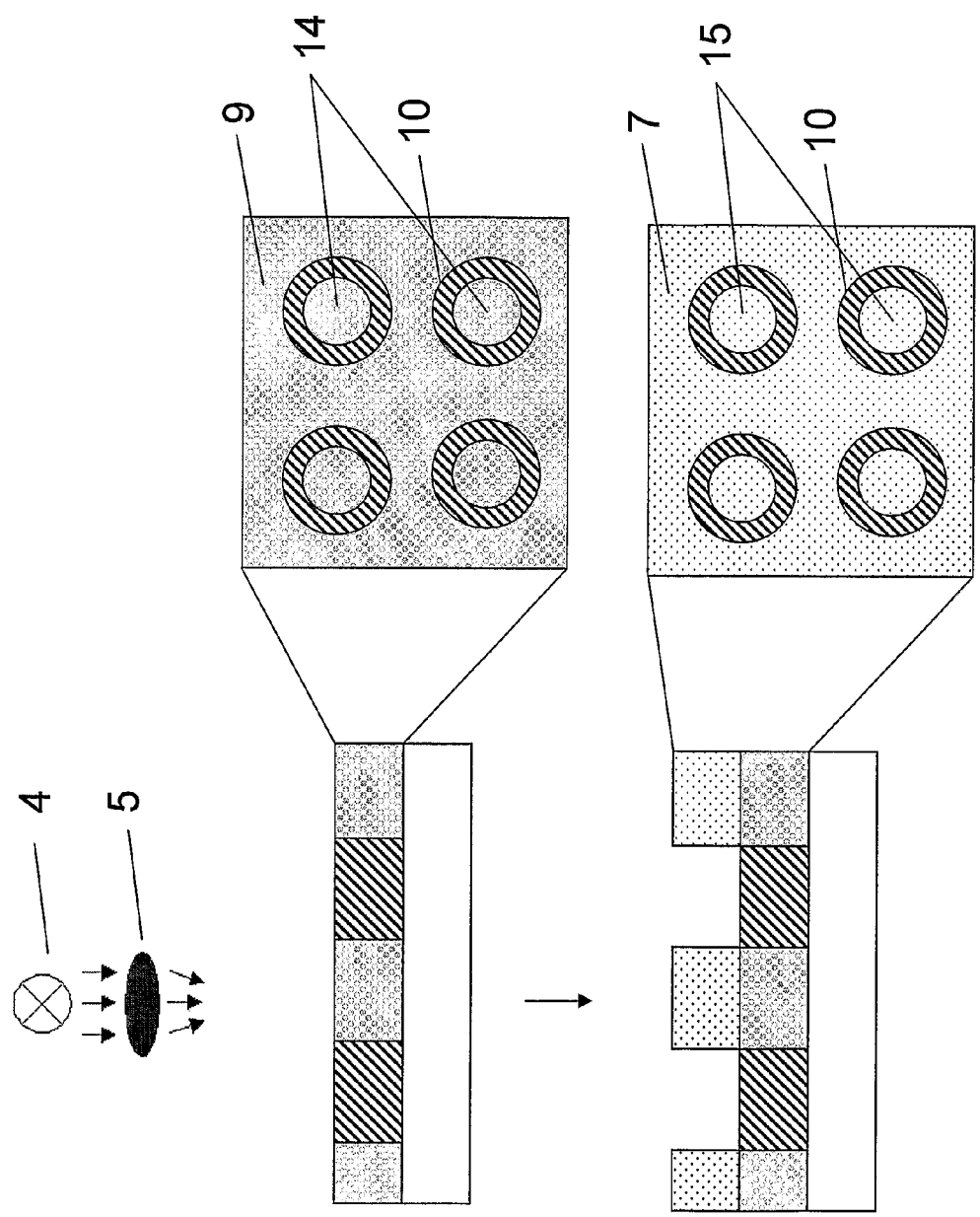
FIG. 7 shows a process where a single direct-image catalytic layer (DICL) is provided on a substrate and patterned to form isolated metal areas.

FIG. 7 shows a process according to a sixth embodiment where a single direct-image catalytic layer (DICL) is provided on a substrate. As above, using the irradiative technique, the absorbed radiation is converted to heat and thus the DICL can be used to pattern the catalytic layer 14 and form isolated electroless plated metal areas 15.

Figure 8:
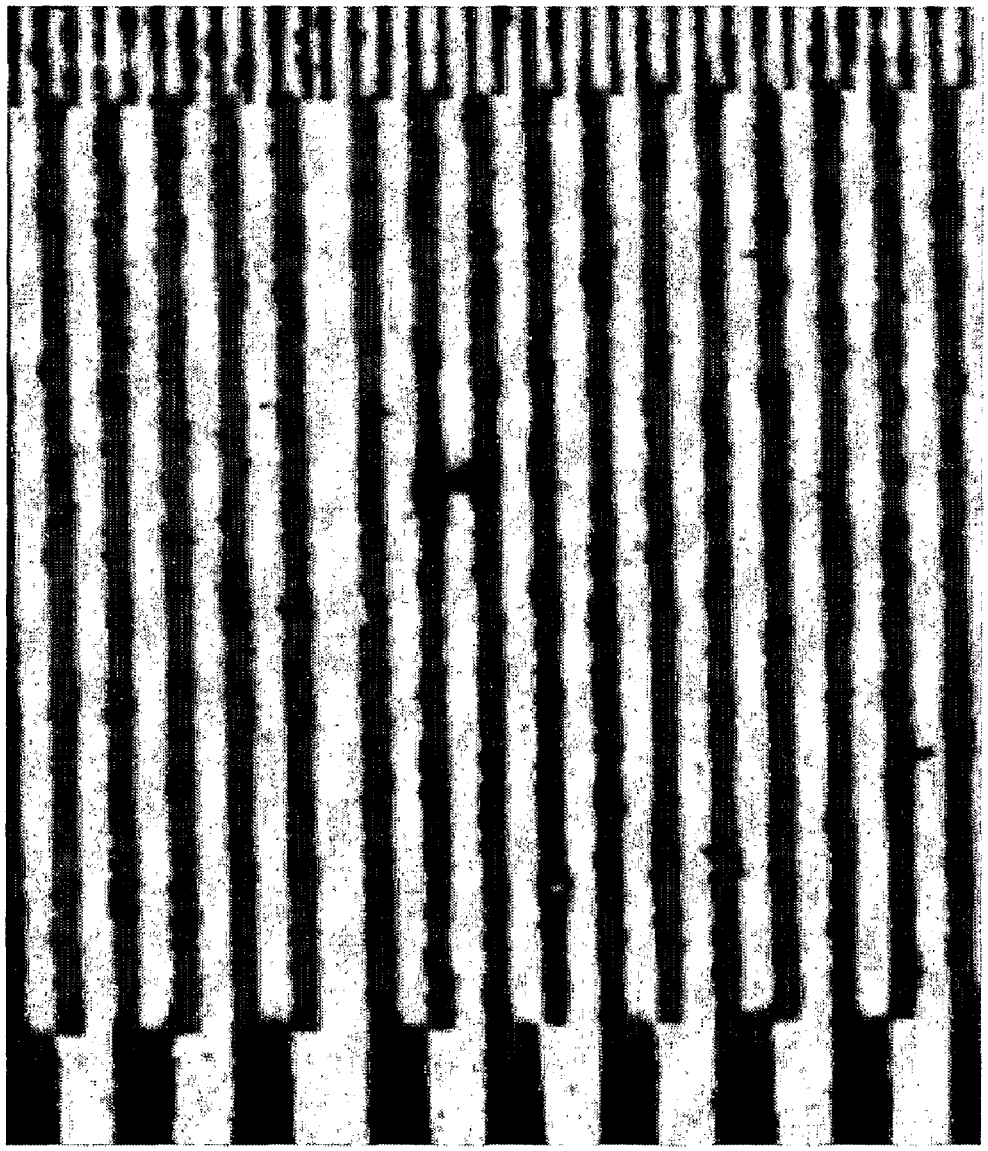
FIG. 8 shows an optical micrograph of copper tracks grown using a catalyst layer that can be directly imaged.

The subsequent steps in which the catalyst is reduced and the metal film is grown are as described above for the first embodiment of the present invention. FIG. 8 shows an optical micrograph of the 20 micron copper tracks on a glass substrate using a method according to the present invention, as described above.

Figure 9:
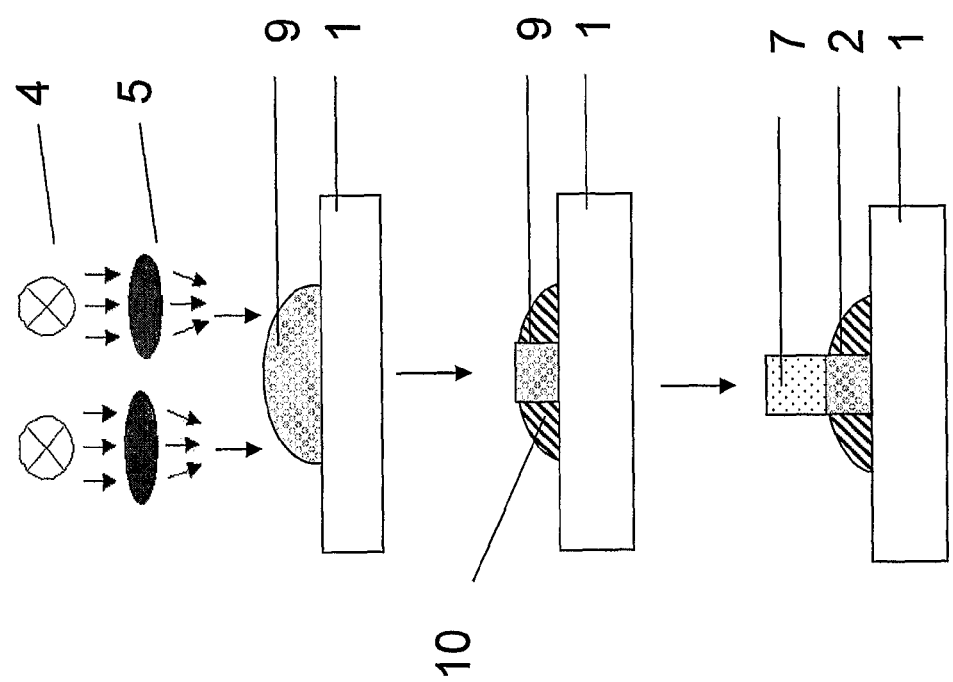
FIG. 9 illustrates processing steps for electroless metal plating on a substrate according to a seventh embodiment that incorporates a catalyst layer that can be directly imaged layer which is coarsely patterned upon deposition

A seventh embodiment is illustrated in FIG. 9. In contrast to the sixth embodiment, the direct-image catalytic layer 9 is deposited using solution-based patterning techniques which allows for the patterning of coarse features, such as ink-jet printing. The thermal imaging step is used to trim the coarse patterned features to generate a finer pattern.

As described above, in the first embodiment, the DICL layer is able to be deposited using less expensive industrial equipment. However, the advantage of the seventh embodiment is seen when costly material is needed to be used, as this process leads to a reduction in the amount of catalytic material that is deposited. Again, as described above, a continuous catalytic film, as seen in the first aspect, can be more prone to buckling due to the stresses in the film that build up during the plating process. In situations where the buckling of the continuous catalytic film is a problem, a coarsely patterned catalytic layer would be preferable, as the stress is not as problematic when the plating area is reduced.

The above described techniques of patterning the catalytic layer may be used for the formation of the source, drain or gate electrodes in an electronic switching device, as well as circuit elements, such as interconnects, bus bars, antennas and other components. In addition, the techniques described above may be used to produce pixel electrodes and pixel capacitors in electronic circuits. Conversions of the catalyst layers using thermal processes are particularly advantageous when considering electronic devices made with conjugated polymer technology, where the semiconducting layer is often sensitive to high energy radiation and excessive solvent developing steps. In addition, catalytic material may be deposited over a large area of the substrate, such as a circuit board. By using a thermal imaging technique as described above, regions of the catalytic layer are inactivated, thus avoiding short circuits and producing isolated contact regions. This process may be used to make contact to fine features such as contact pads or other circuit elements. An additional benefit of such a process is that it would remove the need for components to be placed with high resolution since connection to their contact pads could be achieved digitally using the above process.

A semiconductor layer, in the case of a top-gate configuration or a dielectric layer, in the case of a bottom-gate configuration may then be deposited directly on top of the electroless deposited metal regions. These additional layers may be preferably coated from solution by standard thin film coating techniques, including but not limited to spin, dip, blade, bar, slot-die, or spray coating, inkjet, gravure, offset or screen printing. In the case of a top-gate configuration, a gate electrode may then be deposited on top of the semiconductor layer. This requires careful adjustment of the solvents of the underlying layers in order to avoid dissolution or swelling of the semiconducting layer (see WO01/47093).

EXAMPLE

Formation of a Top-Gate FET Incorporating Copper Plated Gates

Figure 10:
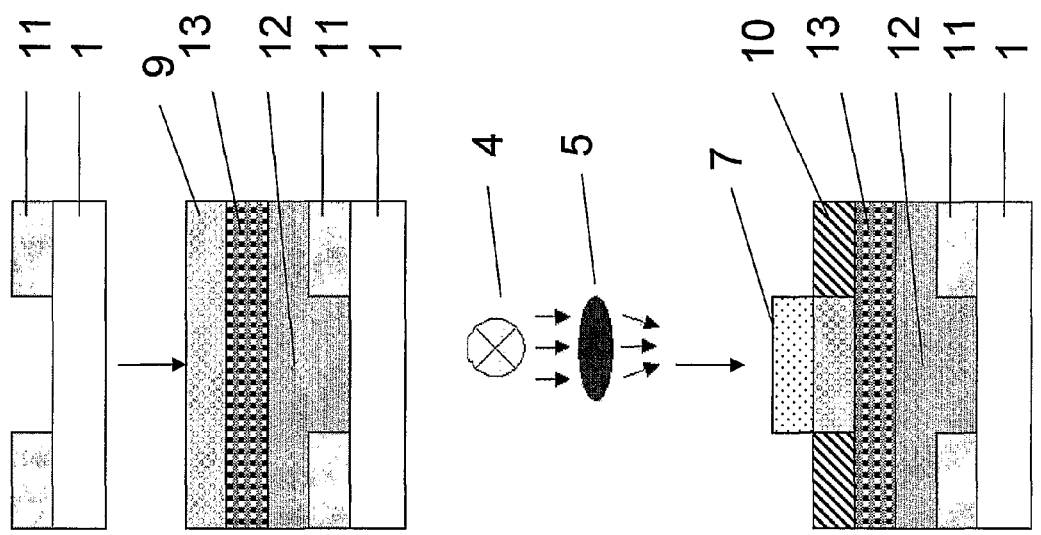
FIG. 10 shows a process according to an eighth embodiment for producing a FET device by the formation of an electroless plated metal on a laser-patterned substrate.

A method according to an eighth embodiment for producing a FET device by the formation of an electroless plated metal on a laser-patterned substrate is shown in FIG. 10. Conductive material is deposited and patterned on a substrate 1 to form source and drain electrodes 11. The substrate may be either glass or a polymer film, but preferably a plastic substrate such as polyethyleneterephtalate (PET) or polyethylenenaphtalene (PEN) is used. A patterned conductive layer 11 of a conducting polymer, such as PEDOT, or a metallic material, such as gold or silver, is deposited through solution processing techniques such as, but not limited to, spin, dip, blade, bar, slot-die, or spray coating, inkjet, gravure, offset or screen printing, or evaporation, and photolithography techniques.

Once the conductive layer has been patterned to form the source and drain electrodes, a layer of semiconducting material 12 may then be deposited over the substrate and patterned electrodes. The semiconducting layer may consist of materials such as, but not limited to, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating.

A layer of gate dielectric material 13 is then deposited onto the layered substrate. Materials such as polyisobutylene or polyvinylphenol may be used as the dielectric material, but preferably polymethylmethacrylate (PMMA) and polystyrene are used. The dielectric material may be deposited in the form of a continuous layer, by techniques such as, but not limited to, spray or blade coating. However, preferably, the technique of spray coating is used.

This is followed by the deposition of a direct-imaging catalytic layer (DICL) over the dielectric layer, through solution processing techniques such as, but not limited to, spin, dip, blade, bar, slot-die, or spray coating, inkjet, gravure, offset or screen printing, or evaporation, and photolithography techniques. The DICL consists of a conductive material that is capable of converting absorbed radiation to heat, and is deposited and patterned on a layered substrate 14. An infrared absorbing material, such as carbon black is added to the layer as a catalyst to absorb the infrared radiation. The preferred film thickness is between 30 nm and 1 micron and should have an optical density of at least 0.15 at 835 nm. The preferred catalyst formulation had the polymer binder and palladium acetate dissolved in a 50:50 mixture of propylene glycol methyl ether and diacetone alcohol.

The absorption of radiation by the direct-imaging catalytic layer results in selective regions of the layer becoming inactive as a catalyst. A 832 nm infrared laser diode which has a 5 micron spot size is used as the infrared light source to allow for high resolution patterning. The preferred fluency of the laser is 1000-2000 mJ/cm$^2$.

To form the gate electrode 14 of the FET device, the substrate is exposed to a reaction solution of metal ions and a reducing agent, which initiates the growth of a metal film on the above described unexposed regions of the catalyst layer. This then allows electroless deposition of a metal layer. By exposing the catalyst layer to a reaction bath consisting of the metal ions of choice and an agent capable of reducing those ions into a metal, the growth of the desired metal film will occur. This again may occur as a result of a number of techniques, including but not limited to methods of dipping the substrate into the solution and inkjet printing the solution on to the substrate. Metals such as but not limited to copper, nickel, platinum, palladium, cobalt, and gold can be deposited using this technique. In a preferred method, a copper film is grown using an aqueous reaction bath consisting of approximately 9% copper (II) sulfate, 9% formaldehyde, 4.5% (2-hydroxypropyl)ethylenediamine, 2% methanol, 4% sodium hydroxide, and 0.05% potassium cyanide. The rate of copper deposition can be tuned by further diluting this solution with water.

Possible materials that may be used for the semiconducting layer, includes any solution processible conjugated polymeric or oligomeric material that exhibits adequate field-effect mobilities exceeding $10^{-3}$ cm$^2$/Vs and preferably exceeding $10^{-2}$ cm$^2$ Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit. Patterning processes, as described above, may also be used to pattern other circuitry components, such as, but not limited to, interconnects, resistors and capacitors.

With the methods described above, no predetermined pattern is required on the substrate prior to the deposition of the catalyst material. This has the benefit of reducing the number of processing steps required. Also, an added advantage over processes carried out in the prior art is that during the electroless plating process, the metallic film will only grow over the areas that were not exposed to the thermal imaging laser. This reduces the material cost by growing metal only where it is needed, and does so without using chemical etching or developing steps to remove portions of the catalytic layer after exposure to the radiation. Finally, the methods described above do not require the conductive regions to be inkjet printed onto the layered substrate (see WO02/095805).

Furthermore, the use of a thermal imaging technique using infra-red radiation to pattern the catalyst layer has particular advantages, as described below. Electroactive or conjugated polymers are found to be generally less sensitive to infra-red light compared to UV light, and the degradation of any such underlying layers can therefore be reduced. Also, with an infra-red thermal imaging process, a threshold level of radiation is required for activation/deactivation, and there is therefore no concern about degradation or accidental deactivation/activation of the catalyst layer material upon exposure to sunlight, which could be expected to be a concern if, for example, a UV-photosensitive material were used for the catalyst layer.

While all the advantages of ink-jet printing can still be utilized in the present invention it overcomes problems with the low resolution and relatively low degree of accuracy achievable with solution-based printing techniques. This is particularly important for applications where narrow linewidth structures such as interconnects with a linewidth of less than 10-20 micrometers are required.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of forming a metal deposit on a substrate, the method including:
   providing a substrate with a first layer of a catalyst material for the deposition of metal from a solution of metal ions, which catalyst material is deactivatable by heating;
   using an irradiative technique to selectively heat selected regions of the first layer to pattern the first layer into active and non-active regions; and
   exposing the resulting pattern of active and non-active regions to a solution of metal ions whereby metal is selectively deposited therefrom onto the active regions of the first layer.

2. A method according to claim 1, wherein the said irradiative technique forms active regions of the said first layer isolated by non-active regions from other surrounding catalytically active regions.

3. A method according to claim 1, wherein a thermal imaging layer is provided below said first layer to assist the selective heating of said selected regions of the first layer.

4. A method according to claim 1, wherein a thermal imaging layer is provided over said first layer to assist the selective heating of said selected regions of the first layer; and including the further step of removing the thermal imaging layer after the step of patterning the first layer into non-active and active regions.

5. A method according to claim 1, wherein the radiation is of infrared wavelength.

6. A method according to claim 1, including the step of selectively depositing the first layer onto selected locations of the substrate corresponding coarsely to those locations where metal is to be deposited.

7. A method of forming a metal deposit on a substrate, the method including:
   depositing on selected locations of a substrate coarse zones of a first layer of a material whose activity as a catalyst for the deposition of metal from a solution of metal ions is adjustable by an irradiative technique;
   using said irradiative technique to pattern each coarse zone into active and non-active regions; and
   exposing the resulting pattern of active and non-active regions to a solution of metal ions whereby metal is selectively deposited therefrom onto the active regions of the coarse zones of the first layer.

8. A method according to claim 7, wherein said first layer zones are deposited by ink-jet printing.

9. A method according to claim 1 of forming at least one metal element of an electronic device.

10. A method according to claim 9, wherein said electronic device forms a component of an electrical or electronic device.

11. A method of producing an electrical or electronic circuit, including the step of forming at least one metal element thereof by a method according to claim 1.

12. A method according to claim 11, wherein the electrical or electronic circuit is a logic circuit.

13. A method according to claim 11, wherein the electrical or electronic circuit is a display or memory device including active matrix circuitry.

14. A method according to claim 11, wherein the electrical or electronic device comprises an array of interconnections.

15. A method according to claim 1, wherein the first layer comprises a composition including a catalyst for the reduction of metal ions, and a chromophore.

16. A method according to claim 15, wherein the chromophore is a chemical moiety that absorbs infrared radiation.

17. A method according to claim 15, wherein the chromophore is carbon black.

18. A method according to claim 1, wherein the deposition of metal from the solution of metal ions is an electroless plating technique.

19. A method of forming a metal deposit on a substrate, the method including:
   providing a substrate with a first layer of a catalyst material for the deposition of metal from a solution of metal ions, which catalyst material is deactivatable by heating;
   using an irradiative technique to selectively heat selected regions of the first layer to pattern the first layer into active and non-active regions; and
   using the resulting pattern of active and non-active regions to control the deposition of metal onto the substrate from a solution of metal ions.

* * * * *